United States Patent [19]

Onodera et al.

[11] 4,110,783
[45] Aug. 29, 1978

[54] SOLDER LAYER FOR A SEMI-CONDUCTOR DEVICE CONSISTING OF AT LEAST ONE GROUP V ELEMENT, AT LEAST ONE RARE ELEMENT AND ALUMINUM

[75] Inventors: Hisakichi Onodera; Masateru Suwa; Jin Onuki; Yoshiteru Shimizu, all of Hitachi, Japan

[73] Assignee: Hitachi, Ltd., Japan

[21] Appl. No.: 766,503

[22] Filed: Feb. 7, 1977

[30] Foreign Application Priority Data

Feb. 9, 1976 [JP] Japan .................................. 51-12320

[51] Int. Cl.² ..................... H01L 23/48; H01L 29/46; H01L 29/62
[52] U.S. Cl. ......................................... 357/67; 357/65
[58] Field of Search ................................... 357/65, 67

[56] References Cited

U.S. PATENT DOCUMENTS

| | | | |
|---|---|---|---|
| 2,321,071 | 6/1943 | Ehrhardt | 357/65 |
| 2,381,025 | 8/1945 | Addink | 357/65 |
| 2,555,001 | 5/1951 | Ohl | 357/65 |
| 3,211,595 | 10/1965 | Bernstein | 357/67 |
| 3,307,088 | 2/1967 | Fujikawa et al. | 357/67 |
| 3,574,676 | 4/1971 | Gambino et al. | 357/67 |
| 3,987,480 | 10/1976 | Diguet et al. | 357/65 |
| 4,005,454 | 1/1977 | Froloff et al. | 357/65 |

*Primary Examiner*—Andrew J. James
*Attorney, Agent, or Firm*—Craig & Antonelli

[57] ABSTRACT

A semi-conductor device comprising a silicon body having an exposed surface of N-type conductivity layer and a substrate bonded to the exposed surface by means of a layer of a new solder material, the solder material being an alloy consisting essentially of 2 to 12% by weight of at least one element of Group V of the periodic table, preferably antimony, and 0.01 to 5% by weight of at least one of rare earth elements, for example, Misch metal and aluminum being balance on the basis of total weight of the solder material. An increase in FVD of the device in which a conventional aluminum solder is used is prevented by the use of the new solder materials.

4 Claims, 6 Drawing Figures

SOLDER LAYER FOR A SEMI-CONDUCTOR DEVICE CONSISTING OF AT LEAST ONE GROUP V ELEMENT, AT LEAST ONE RARE ELEMENT AND ALUMINUM

This invention relates to a semi-conductor device having such a structure that a support disk is bonded to an N-type exposed surface of silicon body by means of a solder layer.

In one type of semi-conductor device, when a silicon body is bonded to a support disk, for example, a molybdenum plate or tungsten plate, pure aluminum has so far been used as the solder material. The solder material of pure aluminum has had no problems when applied to a silicon body having an exposed surface of P-type conductivity. However, when a support disk is bonded to an exposed surface of N-type conductivity of the silicon body, the results have not been satisfactory. That is, in the soldering work using the solder material of pure aluminum, silicon is melted into the molten aluminum layer. When the molten aluminum is cooled and solidified, a portion of silicon in the aluminum layer is recrystallized on the silicon body to thereby form a regrowth layer of silicon. The resulting regrowth layer contains aluminum at a relatively high concentration, and thus is of P-type conductivity. When there is no problem in the case of a silicon body having only an exposed surface of P-type conductivity, in the case of a silicon body having an exposed surface of N-type conductivity, the exposed surface is converted to P-type conductivity, whereby an undesirable PN junction is formed between the N-type body and the converted P-type layer. If a semi-conductor device has the undesirable PN junction, a forward voltage drop (FVD) is increased. Several measures have been taken against such disadvantage. One of the measures is the use of an alloy of aluminum and an element of Group V of the periodic table as a solder material, and has given a successful result (Japanese Laid-Open Patent Application Specification No. 18269/74). According to investigations of the semi-conductor devices in which the aluminum alloy solder disclosed in Japanese Laid-Open Patent Application is used, it was found that the FVD of the devices was still considerably high.

An object of the present invention is to provide an improved semi-conductor device with reduced FVD.

The present invention provides a semi-conductor device which comprises a silicon body having an exposed surface of N-type conductivity and an electro-conductive substrate soldered to the exposed surface of N-type conductivity by means of a layer of a solder material, the solder material being an alloy consisting essentially of aluminum, at least one of elements of Group V of the periodic table, and at least one of rare earth elements.

The present invention has been made as a result of studies of actions of an alloy of aluminum and element of Group V of the periodic table as a solder material. In the studies, it has been found that, when an alloy of aluminum and an element of Group V, for example, antimony, is used as a solder material, silicon is more liable to crystallize in the molten aluminum layer on account of antimony than in the case of pure aluminum. In other words, the amount of silicon which re-crystallizes from the molten aluminum layer is reduced. As a result, the regrowth layer of silicon becomes discontinuous. Even if the regrowth layer is present, FVD can be reduced when the surface of N-type conductivity layer is exposed to the solder layer through the discontinuous regrowth layer of P-type silicon. Therefore, if the regrowth layer can be finely divided more completely, it is possible to lower FVD considerably.

It has been found that addition of rare earth element to the solder material being an alloy of aluminum and antimony has a very great effect upon the more complete division of the regrowth layer. When an alloy of aluminum, at least one element of Group V of the periodic table, and at least one of rare earth elements is used as a solder material, crystallization of silicon in aluminum is much increased and consequently the regrowth of silicon is made small so that the regrowth layer is divided.

The present invention is effective not only upon a silicon body having an N-type exposed surface, but also upon a silicon substrate having both N-type and P-type exposed surfaces on one surface of a silicon body.

A desirable amount of rare earth elements contained in the solder material is 0.01 to 5% by weight on the basis of the total weight of the solder material. In the case of less than 0.01% by weight, the effect is insufficient whereas at the amount of 5% by weight, effect of the addition of rare earth element is saturated. Bonding strength between the solder material and silicon body is decreased, when the amount exceeds 5%, such as 10% by weight. Preferably the amount of the rare earth elements is within a range of from 0.05 to 1% by weight.

In the present invention, the rare earth elements can be added as Misch metal containing lanthanum and cerium as main components, and in almost all the experiments conducted by the present inventors the addition of Misch metal had successful results. Misch metal can be obtained at a lower cost than pure elements such as lanthanum, cerium or the like, and is thus practical.

A desirable amount of the element of Group V of the periodic table is 2 to 12% by weight, on the basis of the total weight of the solder material. In the case of less than 2% by weight, the effect is unsatisfactory, and in the case of more than 12% by weight, bonding strength between the solder and silicon body is poor. An amount of the element of Group V should preferably be 8 to 11% by weight.

The bonding strength is maintained by a certain amount of aluminum contained in the solder material. An excess amount of the rare earth elements and the elements of Group V in the aluminum alloy solder impair the bonding strength. Furthermore, in the case of more than upper limits, it is difficult to roll the aluminum alloy solder material into a foil.

The elements of Group V of the periodic table include nitrogen, phosphorus, arsenic, antimony, and bismuth, but among these elements antimony is easiest and most convenient to use. It is not easy to incorporate nitrogen into aluminum, and phosphorus and arsenic have high vapor pressures. Thus, it is not easy to obtain alloys of desired compositions from these elements. Bismuth and aluminum are liable to separate into two layers, and thus it is not easy to obtain a homogeneous alloy. On the other hand, antimony can easily be alloyed with aluminum. When phosphorus or arsenic is used, an alloy plate of rare earth element and aluminum is prepared in advance, then phosphorus or arsenic is vapor-deposited onto the alloy plate, the alloy plate is placed between the deposition layer of phosphorus or arsenic on a silicon body and an electro-conductive substrate, and the resulting solder material is melted by heating. Phosphorus or arsenic can be used in this manner.

The present invention will be described in detail, referring to Examples by use of the accompanying drawings.

EXAMPLE 1

Figure 1:
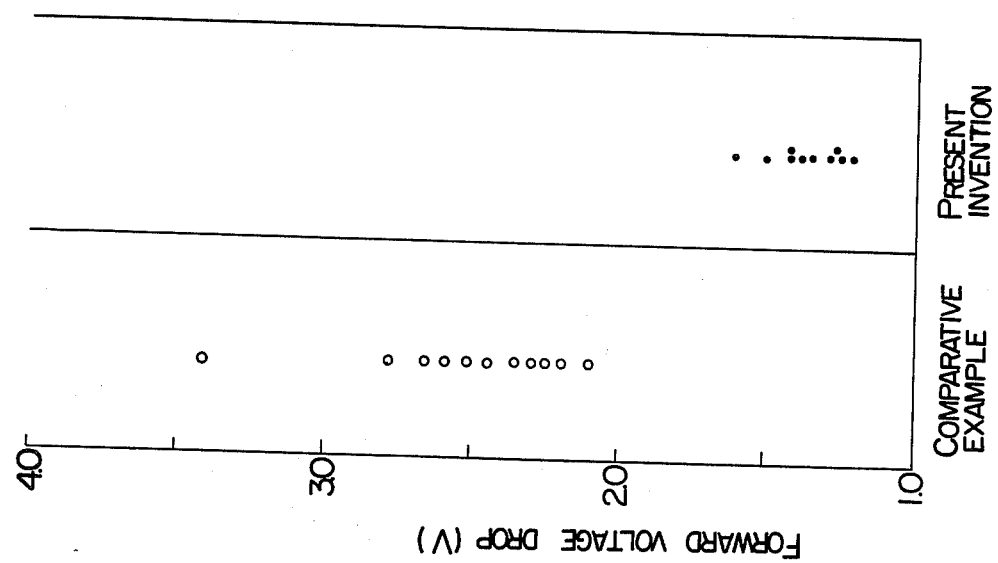
FIG. 1 is a graph showing of forward voltage drops of semi-conductor devices according to the present invention, and those of Comparative Example.

Two kinds of semi-conductor devices of silicon body each having a PN junction and the surface of N-type conductivity layer being exposed to one surface of the body and tungsten substrates soldered onto the surfaces were prepared in the following manners. For one of the two kinds of the semi-conductor devices, pure aluminum was used as a solder material, whereas for the other an alloy consisting of 10% by weight of antimony, 0.5% by weight of Misch metal and aluminum as balance was used as a solder material. The solder material of pure aluminum was vapor deposited onto the surfaces of silicon body to be 20 $\mu$m thick. The solder material of the alloy of aluminum-antimony-Misch metal was prepared into a 20 $\mu$m thick foil, and the foil was placed between the silicon body and the tungsten substrate. As the Misch metal, a commercially available alloy of 45 to 50% by weight of cerium, about 30% by weight of lanthanum, and the balance being comprised of neodymium, promethium, samarium, etc. was used. Soldering was carried out by heating at 720° C in both cases. Semi-conductor devices were produced with these two kinds of semi-conductor bodies, and forward voltage drops thereof were measured. In FIG. 1, forward voltage drops are shown in which a current of 400 A was applied to the semi-conduct devices. In Comparative Example using the conventional solder material of pure aluminum, the forward voltage drops were over 2 V, whereas in the embodiments of the present invention, the forward voltage drops were below 1.6 V, and thus it was confirmed that the forward voltage drops were considerably smaller in the present invention.

Figure 2:
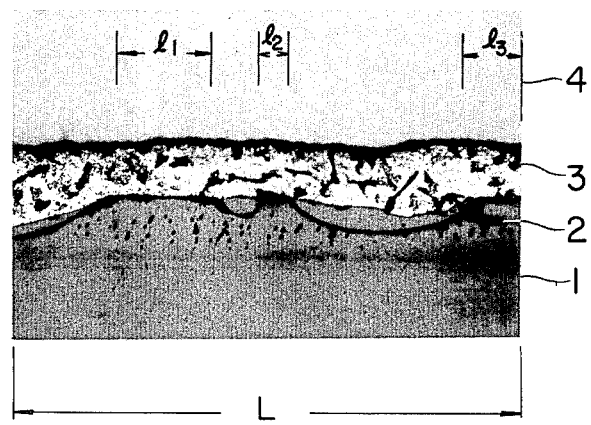
FIG. 2 is a microscopic photograph showing the bonding state of a semi-conductor device according to one embodiment of the present invention.

State of regrowth layer of the semi-conductor device of the present invention was observed. In FIG. 2, a picture of cross-section of the present semi-conductor device is shown, wherein numeral 1 is a silicon substrate, 2 a regrowth layer, 3 a solder material layer, and 4 a tungsten substrate. As is evident from the picture, the regrowth layer is discontinuous due to the effect of antimony and Misch metal. As the surface of N-type conductivity layer is in contact with the solder layer through the discontinuous regrowth layer of P-type conductivity, the FVD of the device is reduced considerably.

EXAMPLE 2

20 $\mu$m thick foils of solder material of 0 to 20% by weight of antimony, 0 to 10% by weight of Misch metal, and aluminum as the balance were placed upon silicon bodies each having an N-type exposed surface on one surface of the silicon body, and tungsten substrate were placed thereon individually, and heated at 720° C, thereby bonding the silicon bodies to the tungsten substrate individually. Misch metal, used in Example 1 was employed. States of the bonding between the silicon bodies and tungsten substrates were investigated to measure discontinuity ratio. The discontinuity ratio is represented as follows:

$$\frac{\text{Total length of exposed surface of N-type conductivity layer } (l_1 + l_2 \ldots l_n)}{\text{Entire length of semi-conductor body } (L)} \times 100 \, (\%)$$

The bonding state between the silicon body and tungsten substrates was good when the amount of antimony was 0 to 12% by weight on the basis of the total weight of the solder material, irrespectively of the amount of Misch metal. When the amount of antimony was over 12% by weight, the bonding strength was not good.

Figure 3:
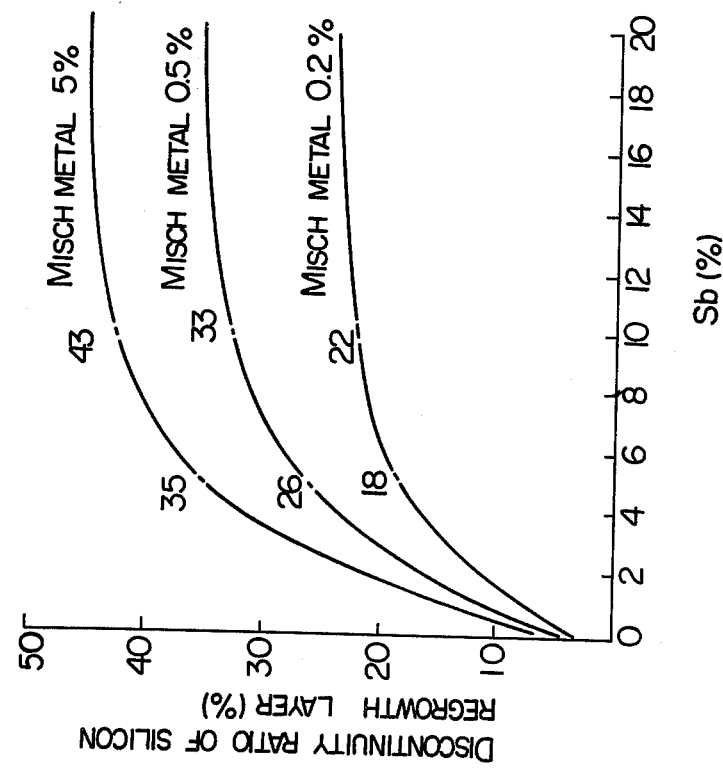
FIG. 3 is a graph showing relations between discontinuity ratio of silicon regrowth layer and amount of antimony.
Figure 4:
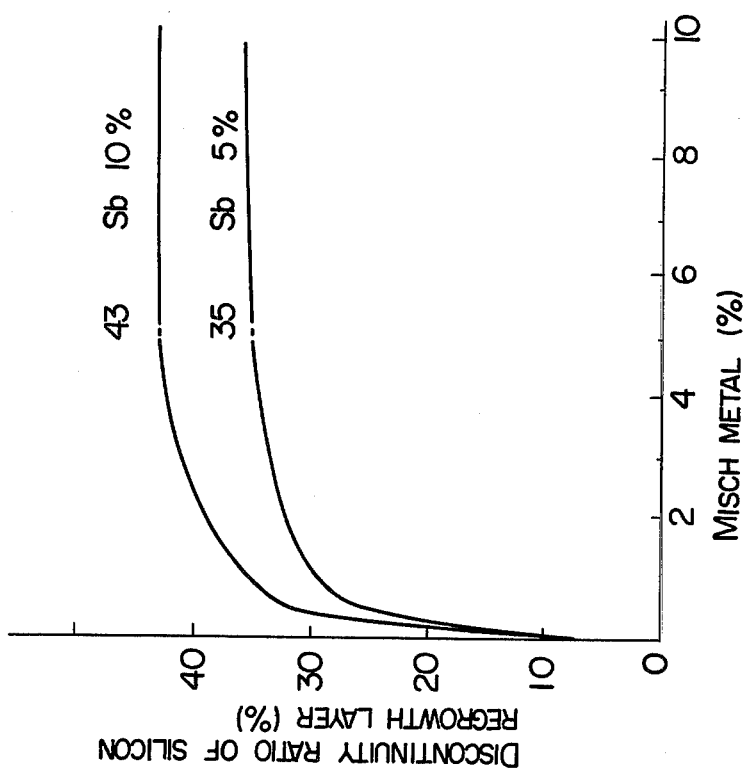
FIG. 4 is a diagram showing relations between discontinuity ratio of silicon regrowth layer and amount of Misch metal.

Relations between the discontinuity ratio of the silicon regrowth layer and the amount of antimony are shown in FIG. 3, and relations between the discontinuity ratio of the silicon regrowth layer and the amount of Misch metal are shown in FIG. 4.

It is evident from FIG. 3 that the discontinuity ratio of the silicon regrowth layer is increased with increasing amount of antimony, but a remarkable improvement of the discontinuity ratio is not expected when the amount of antimony exceeds 12% by weight. It is also evident from FIG. 4 that the discontinuity ratio of the silicon regrowth layer is considerably increased when the solder material contains only a small amount of Misch metal, but there is such a tendency that an increase in the discontinuity ratio is saturated when the amount of Misch metal exceeds 5% by weight.

Figure 5:
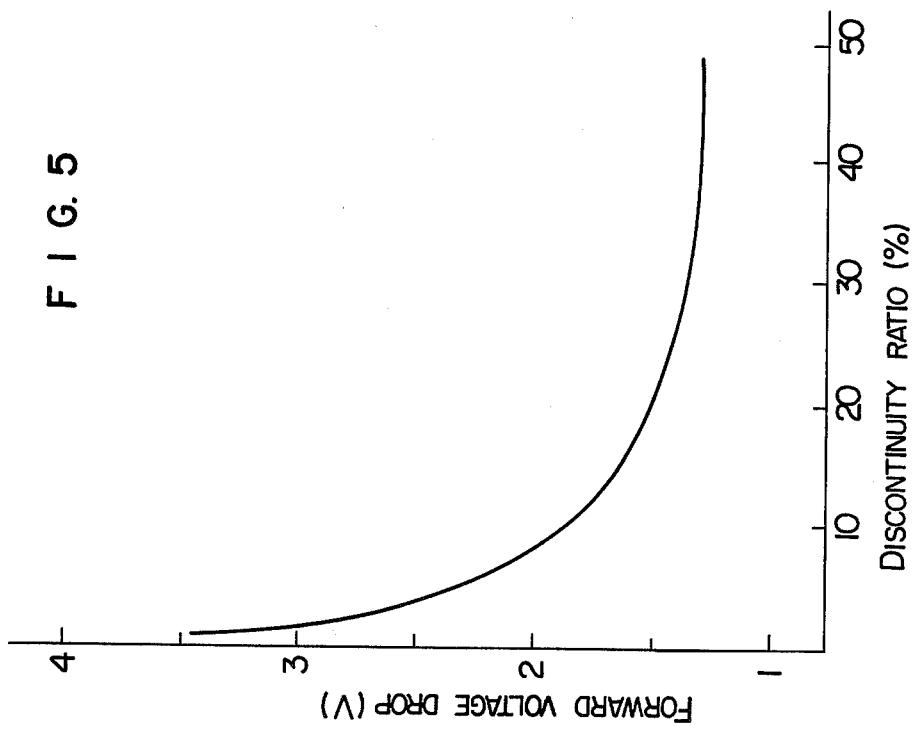
FIG. 5 is a graph showing relations between forward voltage drop and discontinuity ratio of silicon regrowth layer.

Furthermore, relations between the discontinuity ratio of silicon regrowth layer and the forward voltage drop were investigated, and it has been found that characteristics as shown in FIG. 5 are usually obtained in which a current of 400 A was applied to the semi-conductor devices. It is evident from FIG. 5 that, when the discontinuity ratio of the silicon regrowth layer exceeds 10%, the forward voltage drop is considerably small, and especially when the discontinuity ratio exceeds 20%, there is no considerable tendency to lower the forward voltage drop.

The solder materials of alloys of aluminum-antimony-Misch metal employed in the present invention can give a discontinuity ratio of more than 10% as shown in FIGS. 3 and 4, and thus the forward voltage drop can be considerably lowered according to the present invention. On the other hand, the conventional solder materials give a discontinuity ratio of less than 10%, as is evident from FIG. 3 (0% antimony) and FIG. 4 (0% Misch metal).

Figure 6:
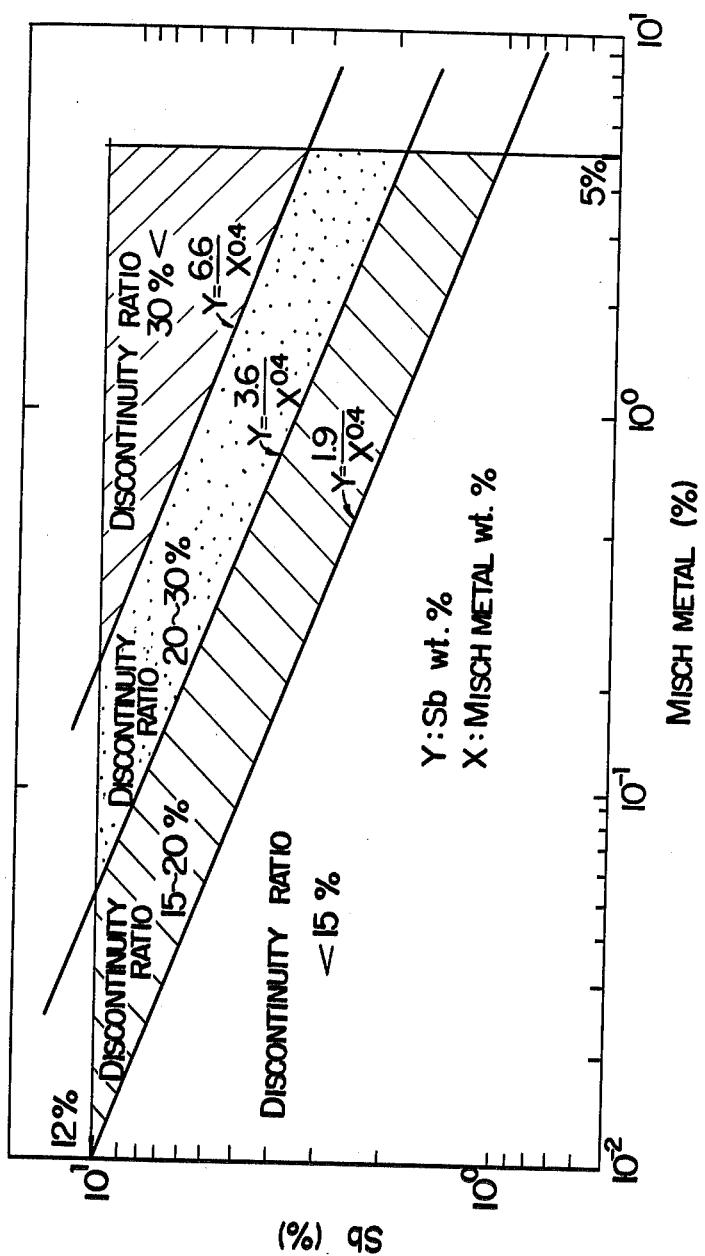
FIG. 6 is a diagram showing relations between amount of antimony and Misch metal and discontinuity ratio.

Relations between the amounts of antimony and Misch metal and the discontinuity ratio were investigated, and the results are given in FIG. 6. The amounts of antimony and Misch metal can be selected based on FIG. 6 for a desirable discontinuity ratio.

In the conventional semi-conductor device, the regrowth layer is formed on the entire N-type exposed surface, and thus the forward voltage drop is disadvantageously increased to a great extent, whereas in the semi-conductor device of the present invention, the regrowth layer is discontinuous, and the discontinuity ratio of the regrowth layer is higher, and consequently the forward voltage drop can be considerably lowered.

In order to obtain semi-conductor devices which satisfy the required bonding strength between silicon body and electro-conductive substrate and the low forward blocking voltage, the discontinuity ratio of the regrowth layer should be 10% to about 40%.

What is claimed is:

1. A semi-conductor device, which comprises a silicon body having an exposed surface of N-type conductivity layer, and a substrate bonded to the exposed surface by means of a layer of solder material, the solder material being an alloy consisting essentially of 2 to 12% by weight of at least one element of Group V of the periodic table, 0.01 to 5% of at least one of rare earth elements and aluminum being balance.

2. A semi-conductor device according to claim 1, wherein the element of Group V of the periodic table is antimony.

3. A semi-conductor device according to claim 1, wherein the rare earth element is Misch metal.

4. A semi-conductor device according to claim 1, wherein the solder material is an alloy consisting essentially of 2 to 12% by weight of antimony and 0.01 to 5% by weight of Misch metal and aluminum as balance on the basis of total weight of the solder material.

* * * * *